(12) United States Patent
Vardeny et al.

(10) Patent No.: US 9,799,842 B2
(45) Date of Patent: Oct. 24, 2017

(54) SPIN-POLARIZED LIGHT-EMITTING DIODES BASED ON ORGANIC BIPOLAR SPIN VALVES

(71) Applicant: The University of Utah Research Foundation, Salt Lake City, UT (US)

(72) Inventors: Zeev Valentine Vardeny, Salt Lake City, UT (US); Tho Duc Nguyen, Salt Lake City, UT (US); Eitan Avraham Ehrenfreund, Haifa (IL)

(73) Assignee: University of Utah Research Foundation, Salt Lake City, UT (US)

( * ) Notice: Subject to any disclaimer, the term of this patent is extended or adjusted under 35 U.S.C. 154(b) by 0 days.

(21) Appl. No.: 14/412,932

(22) PCT Filed: Jul. 3, 2013

(86) PCT No.: PCT/US2013/049375
§ 371 (c)(1),
(2) Date: Jan. 5, 2015

(87) PCT Pub. No.: WO2014/008429
PCT Pub. Date: Jan. 9, 2014

(65) Prior Publication Data
US 2015/0162557 A1    Jun. 11, 2015

Related U.S. Application Data

(60) Provisional application No. 61/668,225, filed on Jul. 5, 2012.

(51) Int. Cl.
*H01L 51/50* (2006.01)
*H01L 51/52* (2006.01)
(Continued)

(52) U.S. Cl.
CPC ......... *H01L 51/5012* (2013.01); *H01L 51/52* (2013.01); *H01L 51/5203* (2013.01);
(Continued)

(58) Field of Classification Search
CPC ...................... H01L 29/66984; H01L 51/5293
See application file for complete search history.

(56) References Cited

U.S. PATENT DOCUMENTS

2008/0152952 A1* 6/2008 Santos ................... B82Y 25/00
                                                    428/811.1

FOREIGN PATENT DOCUMENTS

JP      2003-086383        3/2003
JP      2004296224 A      10/2004
(Continued)

OTHER PUBLICATIONS

International Search Report Issued in PCT/US2013/049375 on Jan. 5, 2015.
(Continued)

*Primary Examiner* — Daniel Whalen

(57) ABSTRACT

Spin-polarized organic light-emitting diodes are provided. Such spin-polarized organic light-emitting diodes incorporate ferromagnetic electrodes and show considerable spin-valve magneto-electroluminescence and magneto-conductivity responses, with voltage and temperature dependencies that originate from the bipolar spin-polarized space charge limited current.

31 Claims, 12 Drawing Sheets

(51) Int. Cl.
    *H01L 51/56*     (2006.01)
    *H01L 51/00*     (2006.01)

(52) U.S. Cl.
    CPC .......... *H01L 51/56* (2013.01); *H01L 51/0038* (2013.01); *H01L 51/5092* (2013.01); *H01L 51/5206* (2013.01); *H01L 51/5221* (2013.01)

(56) References Cited

FOREIGN PATENT DOCUMENTS

| | | |
|---|---|---|
| JP | 2008-166034 | 7/2008 |
| KR | 10-0527340 | 11/2005 |
| KR | 10-2011-0082466 | 7/2011 |
| WO | WO 2011-037828 | 3/2011 |

OTHER PUBLICATIONS

International Preliminary Report on Patentability Issued in PCT/US2013/049375 on Jan. 6, 2015.
Written Opinion Issued in PCT/US2013/049375 on Jan. 5, 2015.
13813776.5, European Search Report, Feb. 17, 2016, 10 pages.

\* cited by examiner

US 9,799,842 B2

SPIN-POLARIZED LIGHT-EMITTING DIODES BASED ON ORGANIC BIPOLAR SPIN VALVES

CROSS-REFERENCE TO RELATED APPLICATIONS

This application is the National Stage of International Application No. PCT/US2013/049375, filed Jul. 3, 2013, which claims the benefit of U.S. Provisional Application No. 61/668,225, filed Jul. 5, 2012, each of which is incorporated herein by reference in its entirety.

STATEMENT REGARDING FEDERALLY SPONSORED RESEARCH OR DEVELOPMENT

This invention was made with government support under NSF/MRSEC; DMR-1104495 awarded by The National Science Foundation; and under FG02-04ER46109 awarded by The Department of Energy. The government has certain rights in the invention.

TECHNICAL FIELD

The present disclosure generally relates to organic spin valves. Particularly, in some embodiments, the present disclosure relates to devices configured to act with bipolar spin-polarized space charge limited current. More particularly, in some embodiments the present disclosure relates to spin-polarized organic light-emitting diodes (spin-OLEDs) based upon such organic bipolar spin valves.

BRIEF DESCRIPTION OF THE DRAWINGS

The embodiments disclosed herein will become more fully apparent from the following description and appended claims in conjunction with the accompanying drawings, in which:

DETAILED DESCRIPTION

Organic spin valve (OSV) devices have been developed showing giant magneto-resistance' (GMR) on the order of 50%. However, the magneto-conductance and magneto-electroluminescence in such devices are voltage and temperature dependent. The present disclosure of bipolar OSV devices demonstrate substantially different voltage and temperature dependencies than those in homopolar OSV devices due to the space charge limited current operation upon reaching double-injection conditions. Organic magneto-resistance (OMAR) has been found using an organic semiconductor without ferromagnetic (FM) electrodes and the bipolar model, space charge limited current operation. The present disclosure presents the connective link between OMAR and OSV devices which previously had not been realized. The devices of the present disclosure provide a step towards organic displays controlled by external magnetic fields, wherein the controlling external field is a magnetic field that is generated from a source outside of the magnetic field generated by the voltage applied to the device to generate light emission.

The present disclosure provides the combination of the abilities of an OMAR device with an OSV device to achieve a spin-OLED based on a novel bipolar OSV device having significant magneto-electroluminescence ranging from about 0.5% to about 1.5%, and particularly up to about 1.2% at the bias voltage ($V_b$) ranging from about 2 V to about 10 V, and particularly about 3.5 V, which follows the coercive fields of the two ferromagnetic electrodes. The present disclosure provides the modification upon OMAR and OSV devices in two features: first, alteration of the previously utilized organic interlayer; and second, a thin layer on the ferromagnetic cathode. The light emitted from such devices may be within the visible to near-IR wavelengths of light, which encompasses wavelengths ranging from about 400 nm to about 850 nm.

Figure 1A:
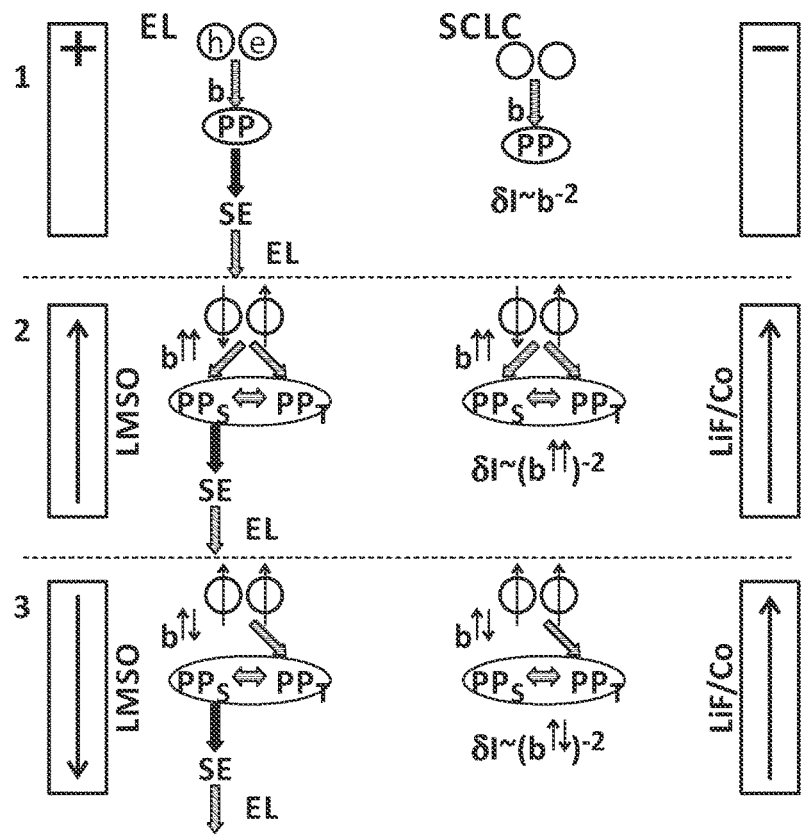
FIGS. 1(a), 1(b), 1(c) illustrate aspects of an exemplary spin-polarized light-emitting diode device (spin-OLED) based upon a bipolar organic spin valve under space charge limited current conditions, including its operating scheme (1(a)), structure (1(b)), and current-voltage (I-V) and electroluminescence-voltage (EL-V) characteristics (1(c))

In an embodiment of an OLED utilizing non-ferromagnetic electrodes (FIG. 1(a), section 1), the net electron-hole bimolecular rate coefficient, b, for forming polaron pairs (PP) does not depend on the magnetic field. When under space charge limited current, the fraction of current that is due to electron-hole (e-h) combination is inversely related to b. In embodiments utilizing ferromagnetic electrodes (FIG. 1(a), sections 2 and 3), spin-aligned carriers are injected and b becomes field dependent, wherein an external magnetic field may be used to change the magnetic polarization of the spin-polarized carrier injecting ferromagnetic electrodes.

In an embodiment with ferromagnetic electrodes, PP formation, magneto-electroluminescence (MEL) intensity, and current density (often referred to as magneto-conductance (MC)) become field dependent. Such embodiments of a spin-OLED are different from previously assumed operation models, such as those observed with homopolar spin-OLEDs, because of intermediate step of PP formation, as well as spin mixing among spin singlet and spin triplet configurations. This spin-mixing channel is responsible for a variety of effects such as monotonic MC and MEL field responses, as well as electroluminescence quantum efficiency that is not limited to 25%. The 25% efficiency limitation is a limitation of OLED's not employing a method to direct the formation of excited electrons in the triplet state back to a light emissive singlet state.

Various embodiments of the device will employ ferromagnetic electrodes that will enable spin polarization ($P_x$) of the excited electrons. In embodiments where the coercive fields ($B_{cx}$) of the various electrodes are different, it is possible to switch the relative magnetization directions between parallel (↑↑) and anti-parallel (↑↓) by sweeping a magnetic field, as is done in an embodiment in FIG. 2. Embodiments that implement coercive magnetic fields with ferromagnetic electrodes affect the spin orientation ($P_x$) of the electrons injected into the device. In some embodiments, the spin orientation of one of the electrons in an injected pair of electrons ($P_1$) may be $P_1$~95% and the orientation of the other electron ($P_2$) may be $P_2$~30%. The range of spin orientation degree for $P_1$ and $P_2$ will vary from 0% to 100%.

Figure 1B:
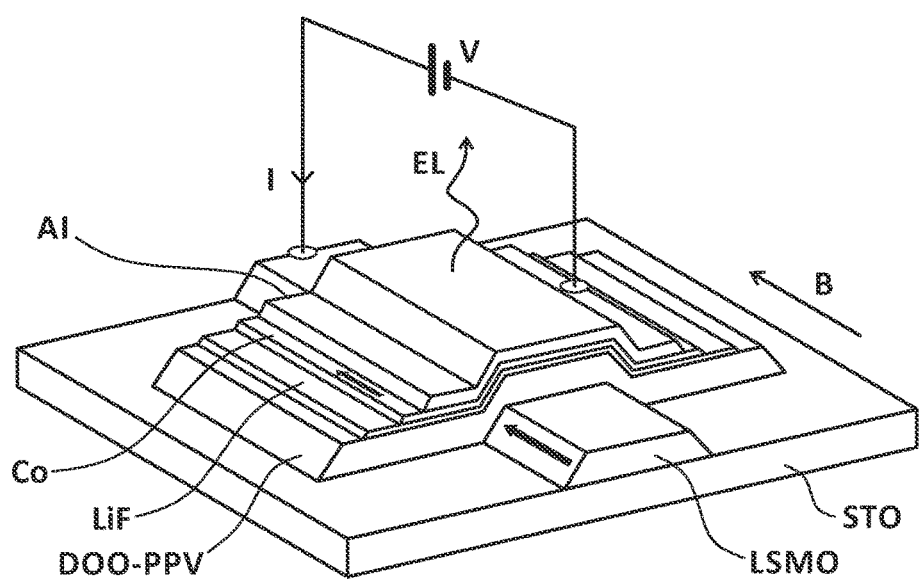

In one embodiment, the device may include a protective layer as a first layer; a first ferromagnetic electrode as a second layer; a thin "buffer" layer comprising a "salt" as the third layer, which, in some embodiments may be a few nanometers thick, and in other embodiments may range from about 0.5 to about 2 nm, or from about 0.8 to about 1.5 nm in thickness; a π-conjugated organic polymer as a fourth layer; a second ferromagnetic electrode as a fifth layer; and optionally, a transparent conductive material as a sixth layer (FIG. 1(b)). In other embodiments, the layers may be in a different order to produce an alternative spin valve, and preferably an alternative bipolar spin valve that exhibits electroluminescence, and preferably magneto-electroluminescence. In yet another embodiment, one or more layers may be removed in order to produce and alternative spin valve. In a further embodiment, layers may be removed and/or rearranged in a different order to produce an alternative spin valve.

In one embodiment, the first layer may be any material that protects the device from damage. Damage to the device could come in the form of oxidative damage, physical damage, or other forms of damage that render the device inoperable. In one embodiment, the material used in this first layer may be aluminum. In another embodiment, the material used in this first layer may be an alloy comprised of aluminum in combination with other elements that form a substance that is oxidation resistant. Other potential metals to be used in alternative embodiments of this first layer include, for example, copper and silver. In some embodiments, this first layer may be several hundred nm thick. In other embodiments, this first layer may range in thickness from less than 10 nm to several hundred nm. In some embodiments this first layer may range in thickness from about 5 nm to about 10 nm. In other embodiments this first layer may range in thickness from about 10 nm to about 100 nm. In still other embodiments this first layer may range in thickness from about 100 nm to about 500 nm.

In some embodiments, this first layer may be transparent. In other embodiments, this layer may be opaque. The choice of whether this first layer is transparent or opaque may be made to suit the application of the device being engineered, with some applications requiring a transparent first layer, and other applications requiring an opaque first layer. Moreover, the choice of whether this first layer is transparent or opaque may be made based upon whether the device being engineered is to exhibit cathode-to-anode oriented electroluminescence, or anode-to-cathode oriented electroluminescence, or both. In other words, the choice of whether this first layer is transparent or opaque may be made based upon whether the device being engineered to emit light in one particular direction relative to the cathode and anode layers of the device, or in both directions.

All three modes of light emission are envisioned, and these three modes may require the choice of specific or alternative materials for the first layer, the fifth layer, and the optional sixth layer, as explained in more detail below. The artisan skilled in designing and constructing spin-OLEDs in accordance with the present disclosure will understand what materials will be sufficiently transparent, or sufficiently opaque, to adapt the spin-OLED to specific functions that may require unidirectional, or bidirectional light emission.

In some embodiments, the first ferromagnetic electrode that comprises the second layer may be a cathode. In other embodiments, the first ferromagnetic electrode that comprises the second layer may be an anode. In some embodiments, this first ferromagnetic electrode is comprised of a conductive metal or metal alloy. In further embodiments, this first ferromagnetic electrode may be composed of cobalt. In particular embodiments, this first ferromagnetic electrode may be composed of cobalt, and may serve as the cathode. In other embodiments, other metals, such as Ni or Fe may also be suitable for use as a cathode. In still other embodiments, alloys of the metals, Co, Ni or Fe, or combinations thereof, may be suitable for use in this first ferromagnetic electrode.

In some embodiments of the disclosed device, the second layer may range in thickness from about 1 nm to about 10 nm. In other embodiments, this second layer may range in thickness from about 2 nm to about 9 nm. In still other embodiments, this second layer may range in thickness from about 3 nm to about 8 nm. In still other embodiments, this second layer may range in thickness from about 4 nm to about 7 nm. In still other embodiments, this second layer may range in thickness from about 5 nm to about 6 nm. In particular embodiments, this second layer may be about 3 nm, 4 nm, 5 nm, 6 nm, or about 7 nm in thickness.

For some ferromagnetic electrodes serving as cathodes, the coercive field may be dependent on the dimensions of the cathode. The coercive field may also be dependent on the composition of the cathode. Hence, the dimensions and/or composition of the ferromagnetic electrode of the second layer may be adjusted as necessary to match the desired coercive field of the cathode of the device. Similarly, the dimensions, and/or composition of the ferromagnetic electrode of the fifth layer, which may serve as the anode, may be adjusted as necessary to match the desired coercive field of anode of the device. Hence, in some embodiments, the dimensions and composition of the ferromagnetic electrode of the second layer, and the dimensions and composition of the ferromagnetic electrode of the fifth layer, are specifically chosen to create a device with specific characteristics, or a device that will respond in a predetermined manner to an externally-applied magnetic field.

In some embodiments, the cathode of the second layer may be transparent; in other embodiments, the cathode of the second layer may be opaque, with either state being chosen to suit the particular need of the device being engineered. In embodiments where the cathode is opaque, the anode may be transparent so as to let emitted light out of the device. In other embodiments where the anode is opaque, the cathode may be transparent so as to let emitted light out of the device. In still other embodiments the cathode and the anode may be transparent to allow light to be emitted from both sides of the device.

Presence of a buffer layer, composed of a salt, such as, in some embodiments, lithium fluoride (LiF), between the cathode and the organic interlayer, may result in an OSV having improved spin-aligned electron injection efficiency and improved charge spin polarization (i.e., improved efficiency in injecting spin-aligned electrons from the cathode into the adjacent organic interlayer). It is thought that the presence of a buffer layer adjacent to the first ferromagnetic electrode may also help prevent occlusions and aggregations of the metal or metal alloy in the second layer. Such occlusions or aggregations can result in irregularities in the thickness of adjacent layers, and can contribute to uneven, and sub-optimal spin carrier (i.e., spin-aligned electron) injection from the cathode into the organic interlayer.

Consequently, in some embodiments of the OSV, a buffer layer is present as the third layer between the cathode (i.e., the second layer, or first ferromagnetic electrode in some embodiments) and the organic interlayer (i.e., the fourth layer). In one embodiment, this buffer layer is composed solely of a salt, and in particular embodiments, the salt is lithium fluoride (LiF). In other embodiments, this layer may include other suitable materials, such as, without limitation, other salts, which enhance the efficiency of injection of spin-aligned electrons from the cathode into the adjacent polymeric interlayer. In other embodiments, this layer may comprise a combination of LiF and one or more other suitable materials.

In some embodiments this third layer has a thickness ranging from about 0.5 nm to about 2.0 nm. In some embodiments this third layer has a thickness ranging from about 0.8 nm to about 1.5 nm. In particular embodiments the thickness of this third layer is about 0.5 nm thick, about 0.6 nm thick, about 0.7 nm thick, about 0.8 nm thick, about 0.9 nm thick, about 1.0 nm thick, about 1.1 nm thick, about 1.2 nm thick, about 1.3 nm thick, about 1.4 nm thick, or about 1.5 nm thick.

In an embodiment of an OSV with LiF as the third layer ranging in thickness of from about 0.8 nm to about 1.5 nm, the LiF layer allows for a voltage independent magneto-conductance after the turn-on voltage ($V_o$) for bipolar injection is reached. In the same embodiment of an OSV with LiF present as the third layer, the turn-on voltage may be substantially lower than that of a similar device lacking a LiF-containing third layer ($V_o$=3.5 V with the LiF layer present vs. $V_o$=10 V without the LiF layer present).

In those embodiments of the OSV having a ferromagnetic metal or metal alloy cathode as a second layer, but lacking a buffer layer composed of a salt, such as LiF, as the third layer, it is thought that hole injection is more efficient than electron injection, leading to unbalanced current density in the device, which may lead to current being carried largely by holes. Without being limited to any one theory, in such a system, it is thought that electroluminescence (EL) intensity is limited by the minority electron injection from the cathode. However, incorporating lithium fluoride as a buffer layer between the cathode and the underlying organic interlayer is thought to be one approach to improving spin-aligned electron injection efficiency from the cathode into the adjacent organic layer. The use of a combination of various metals or metal alloys with buffer layers to make injection of electrons into the organic layer of the OSV more facile, is within the scope of the present disclosure.

In some embodiments, the fourth layer may be an organic polymer. In certain subembodiments, the organic layer may be a π-conjugated organic polymer. In related subembodiments, the organic layer may be a deuterium-enriched π-conjugated organic polymer. In such subembodiments, the organic layer may be a deuterated π-conjugated polymer, in which a substantial number of the hydrogens, and particularly those hydrogens in closest proximity to the backbone chain (i.e., the hydrogens attached directly to intrachain carbon atoms) have been replaced with a deuterium atoms.

Figure 1C:
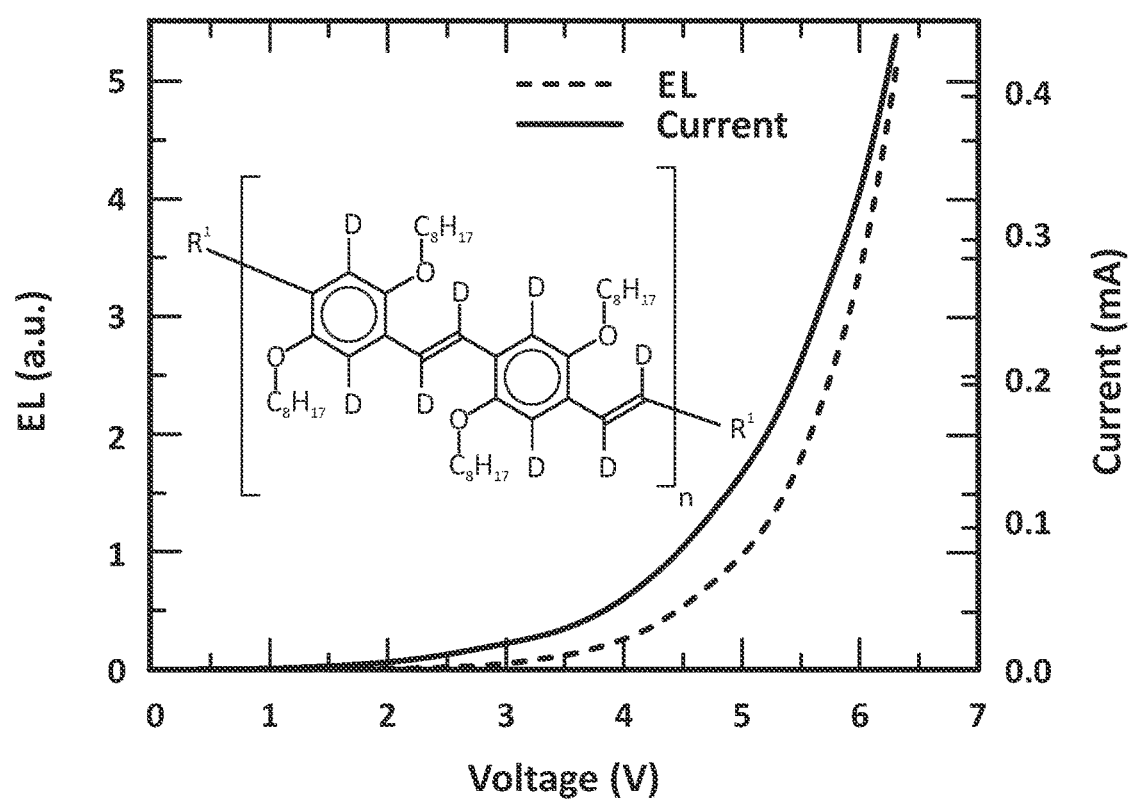
Figure 2A:
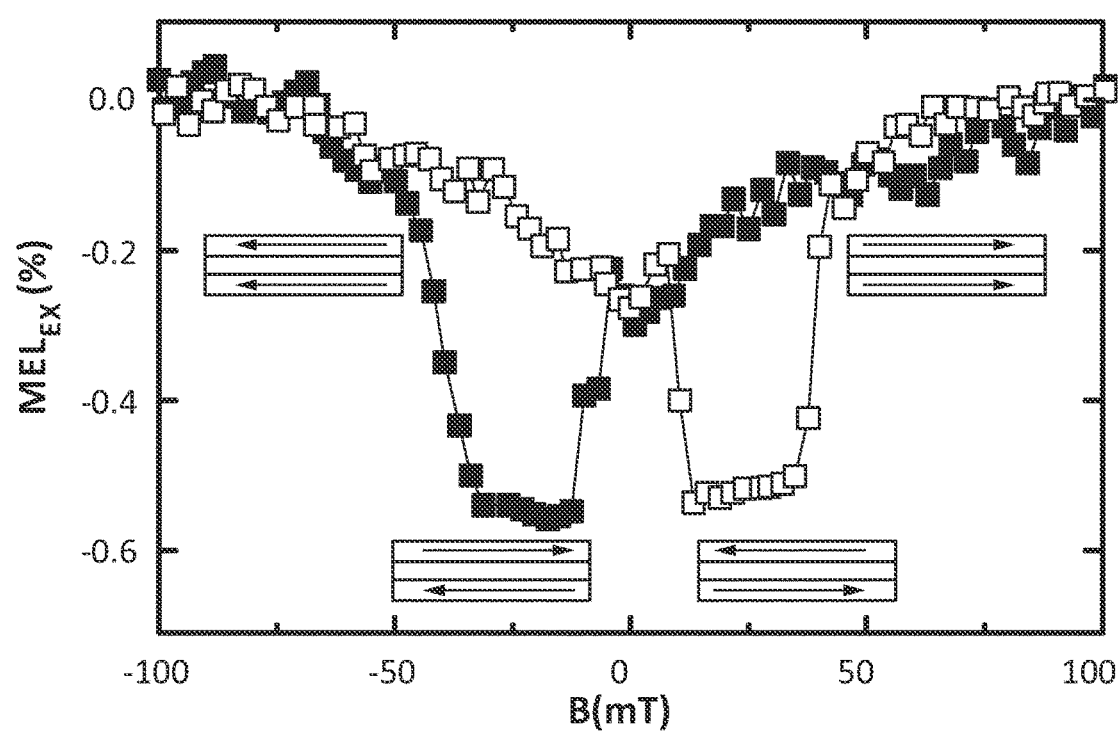
FIGS. 2(a)-2(d) illustrate the magneto-electroluminescence response of an exemplary spin-OLED.
Figure 2B:
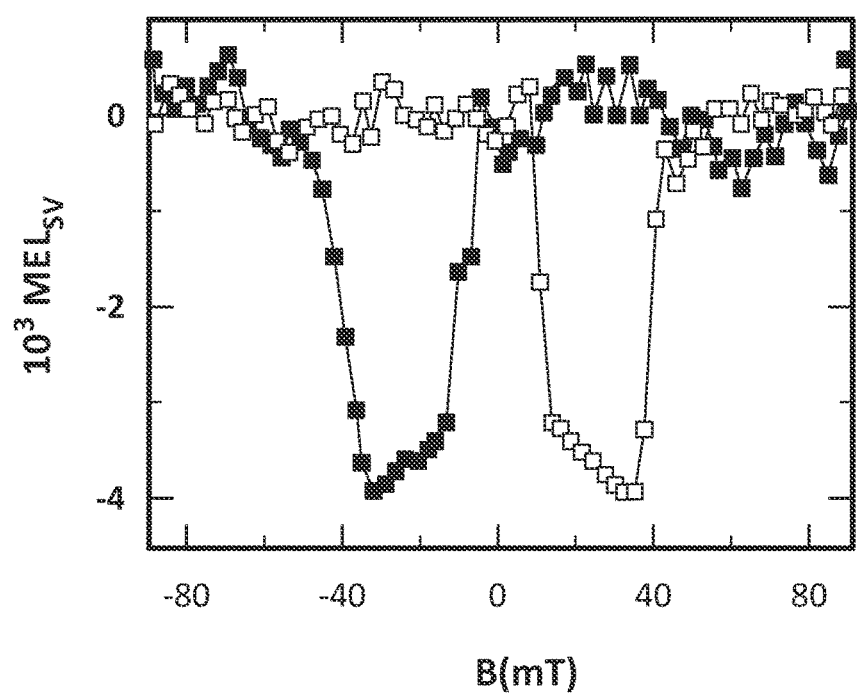
Figure 2C:
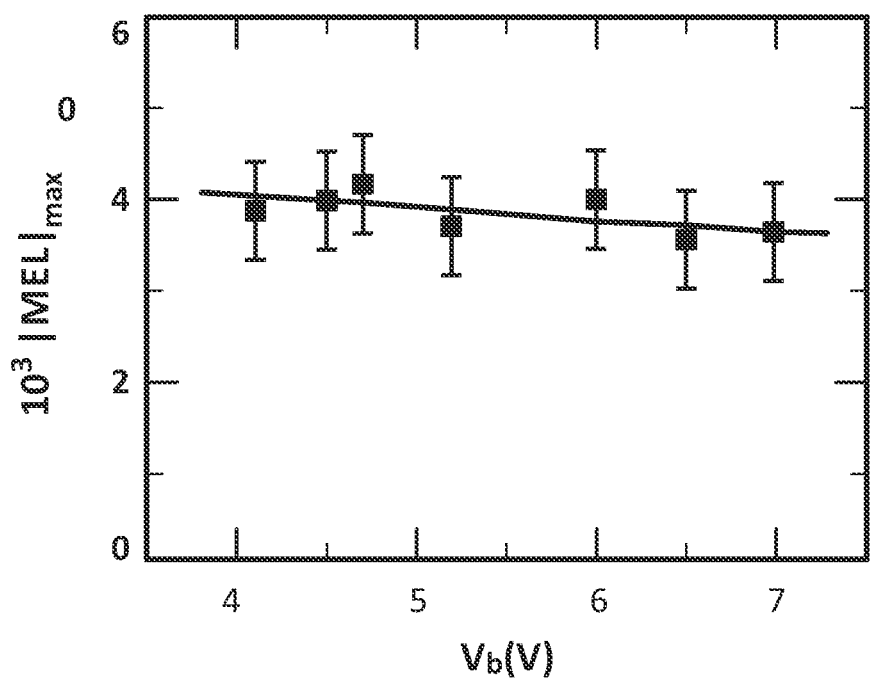
Figure 2D:
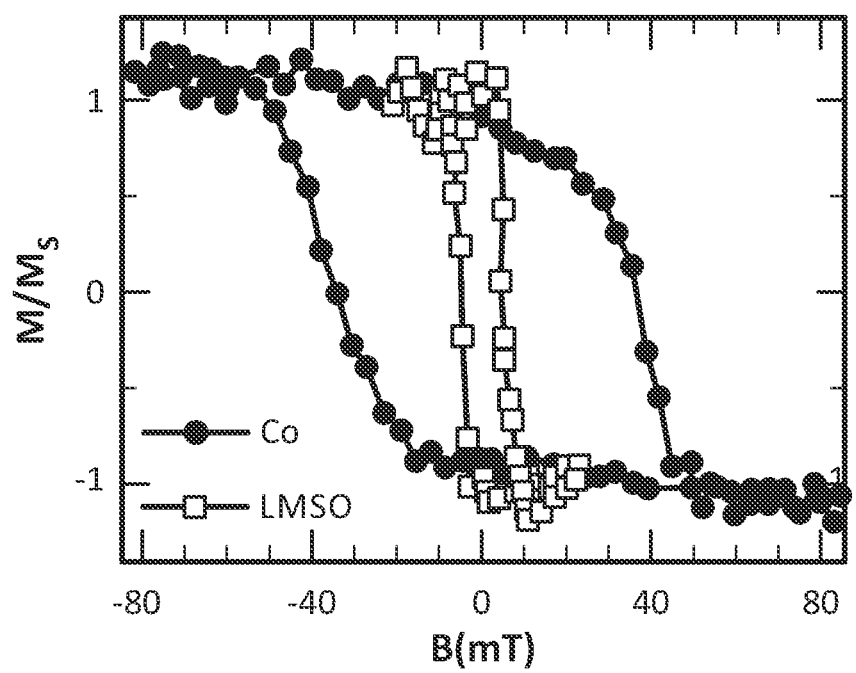
Figure 3A:
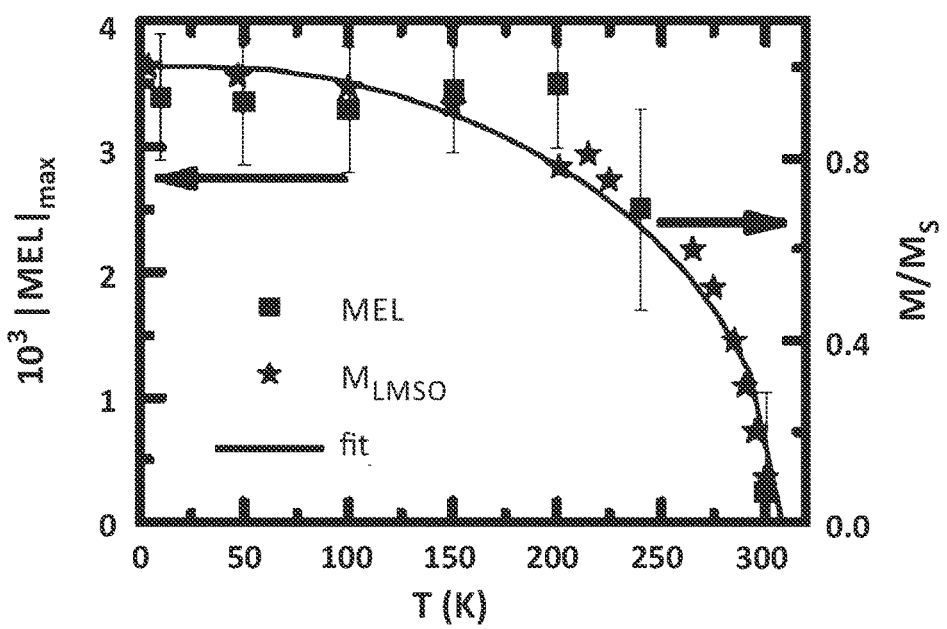
FIGS. 3(a)-3(e) illustrate the maximum magneto-electroluminescence response of an exemplary spin-OLED at various temperatures.
Figure 3B:
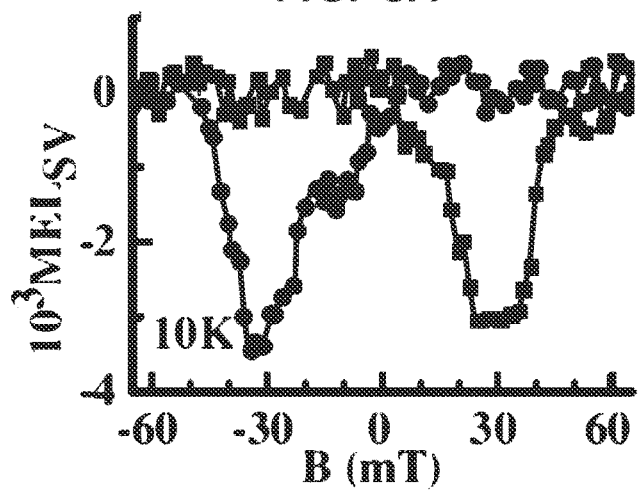
Figure 3C:
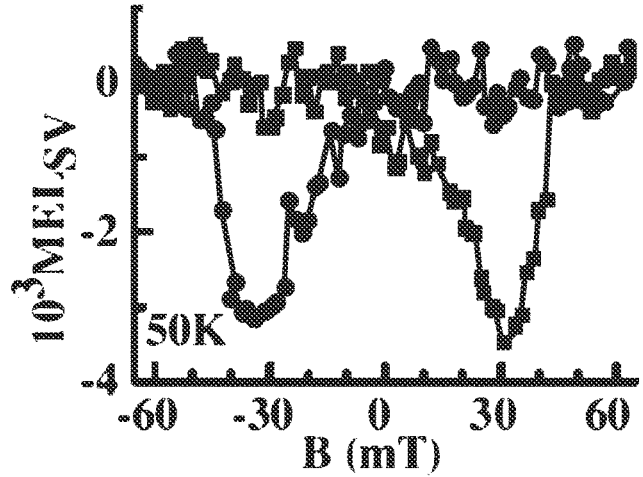
Figure 3D:
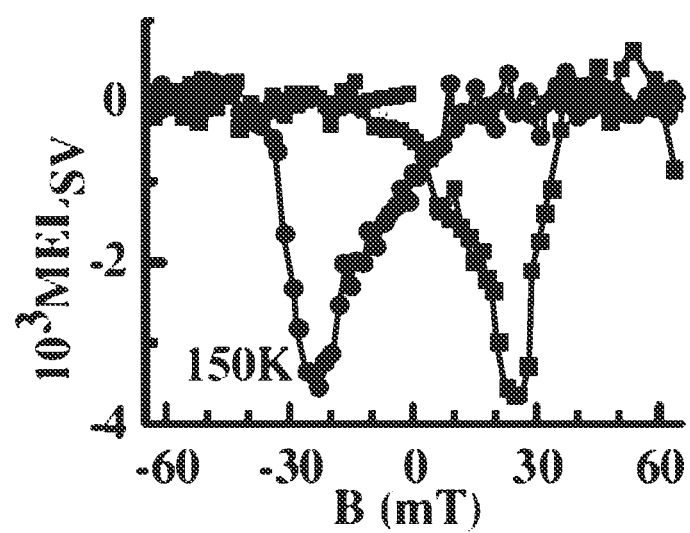
Figure 3E:
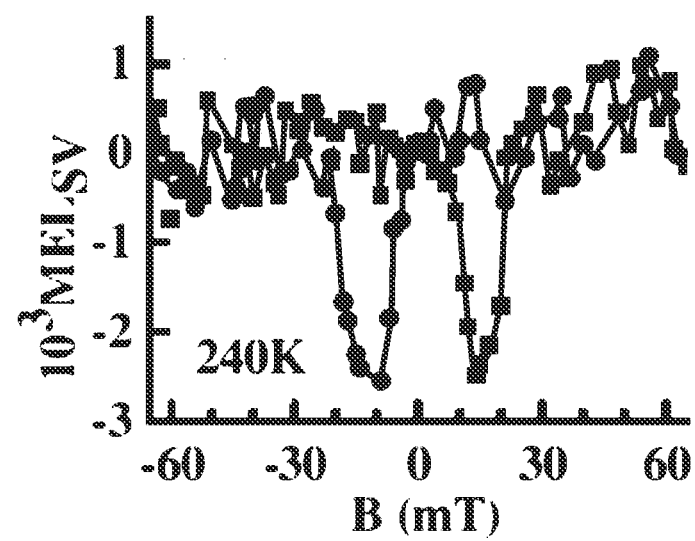
Figure 4A:
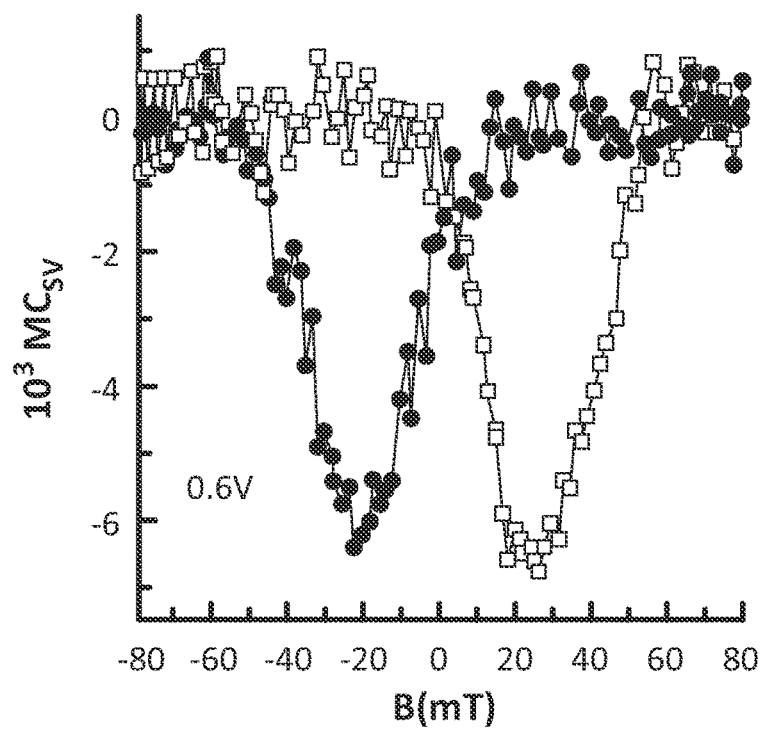
FIGS. 4(a)-4(f) illustrate the magneto-conductance response for exemplary bipolar and homopolar OSV devices.
Figure 4B:
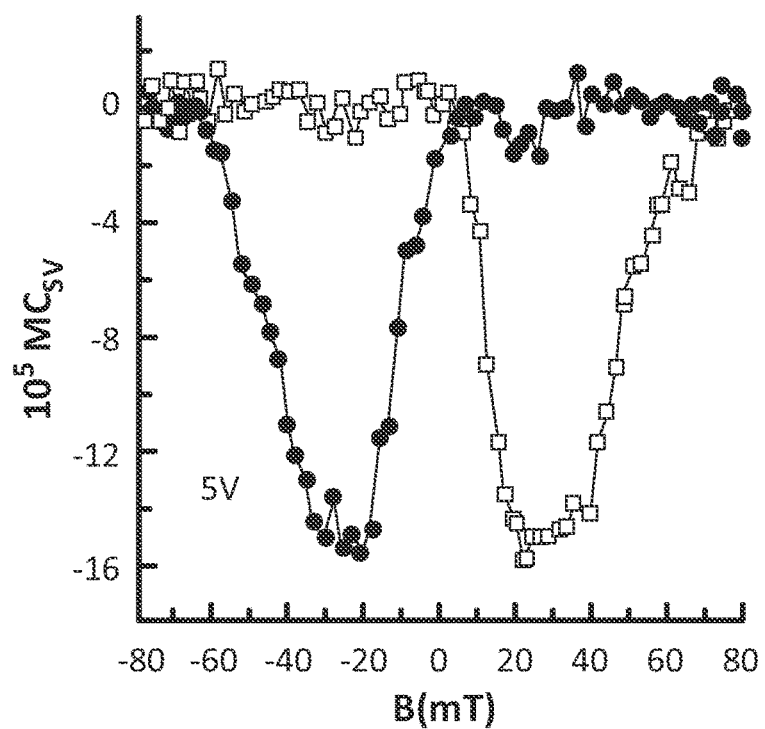
Figure 4C:
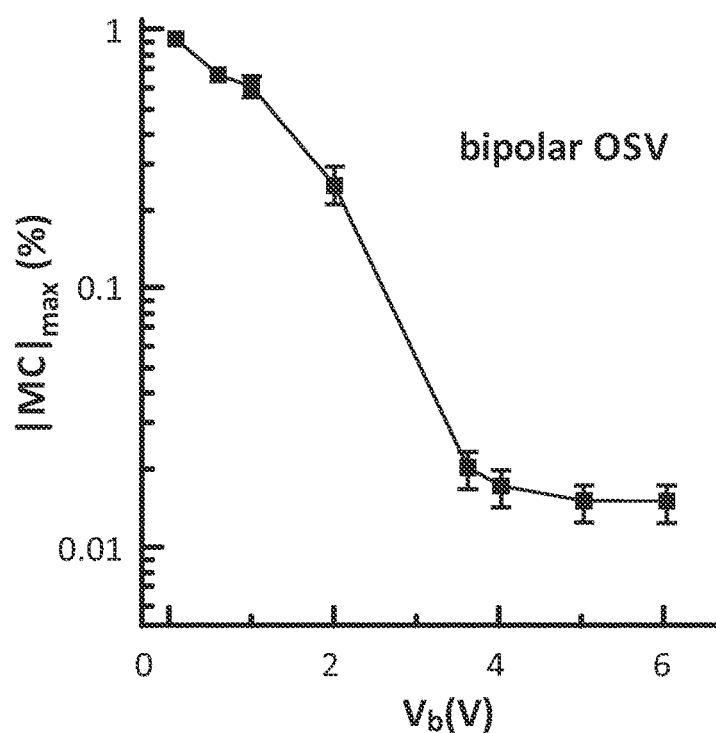
Figure 4D:
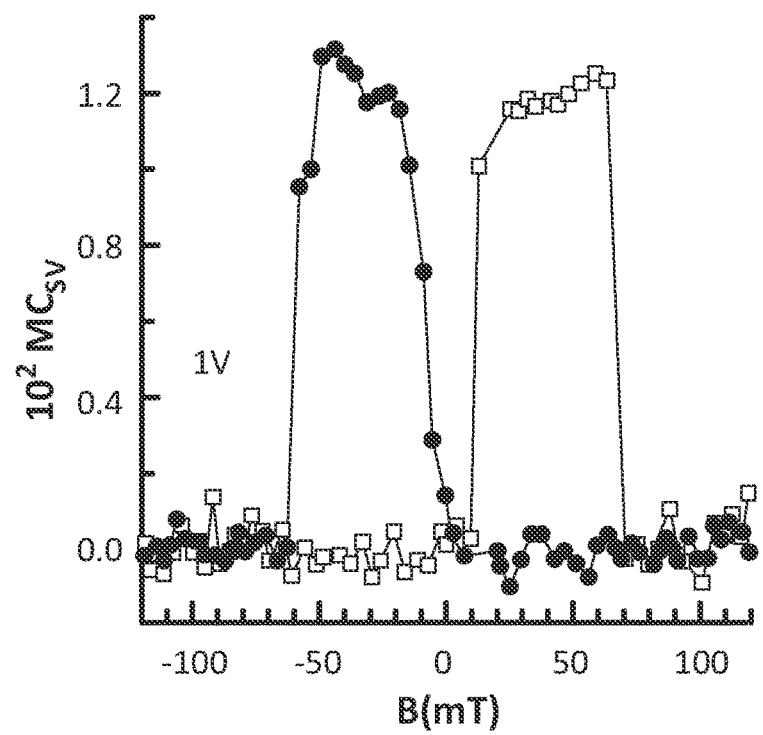
Figure 4E:
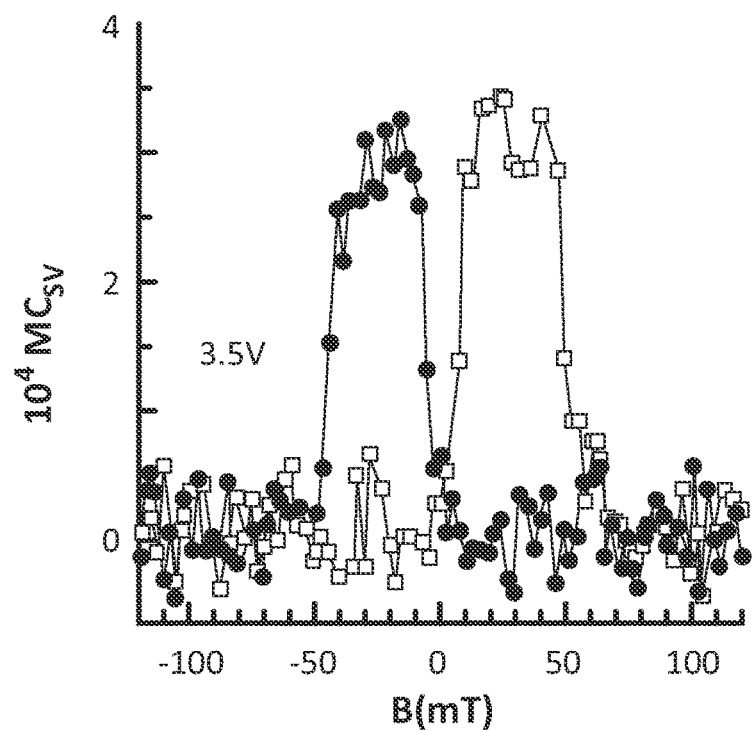
Figure 4F:
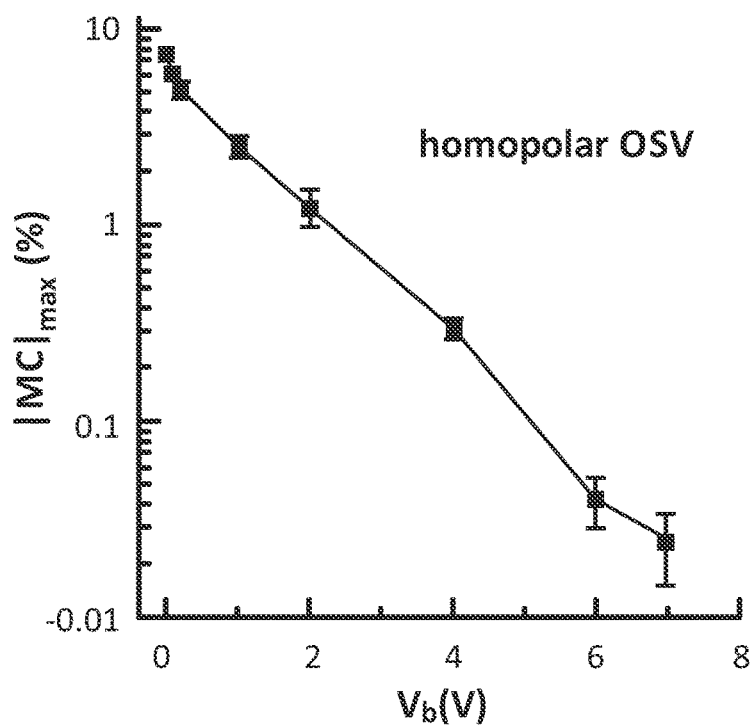

In particular embodiments, the π-conjugated polymer used may be poly(dioctyloxy) phenyl vinylene (H-DOO-PPV). In related particular embodiments, the π-conjugated polymer used may be deuterated poly(dioctyloxy) phenyl vinylene (D-DOO-PPV, inset of FIG. 1(c)). In certain embodiments, the fourth layer containing a π-conjugated polymer, or a deuterated π-conjugated polymer, may range from about 10 nm to about 50 nm thick. In other embodiments, the fourth layer containing a π-conjugated polymer or the deuterated π-conjugated polymer may range from about 15 to about 30 nm thick. In particular embodiments, the fourth layer containing a π-conjugated polymer or a deuterated π-conjugated polymer may be about 15 nm thick, about 16 nm thick, about 17 nm thick, about 18 nm thick, about 19 nm thick, about 20 nm thick, about 21 nm thick, about 22 nm thick, about 23 nm thick, about 24 nm thick, about 25 nm thick, about 26 nm thick, about 27 nm thick, about 28 nm thick, about 29 nm thick, or about 30 nm thick.

The spin diffusion length ($\lambda_s$) of D-DOO-PPV is about 45 nm, which is about three times longer than the spin diffusion length of H-DOO-PPV and is also greater than the thickness of the fourth layer in those embodiments utilizing a 25 nm thick D-DOO-PPV organic layer. The use of other π-conjugated polymers, deuterated or otherwise, with increased spin diffusion lengths, is within the scope of this disclosure. Particularly, the use of deuterated π-conjugated polymer organic layers, in which the average spin diffusion length is greater than thickness of the organic layer employed, is within the scope of this disclosure.

The fifth layer of embodiments of OSVs of the present disclosure may be a ferromagnetic electrode that may also serve as the anode. In some embodiments, this layer may be composed of $LaSrMnO_3$ (LSMO). In particular embodiments, the LSMO may have a stoichiometry of approximately $La_{0.7}Sr_{0.3}MnO_3$, which has been found to have a spin polarization of 100%. Other embodiments may comprise a fifth layer composed of another material that is ferromagnetic. In other embodiments, other elements or alloys that provide spin polarization of electrons may be used as the fifth layer. Other metals or metal-based alloys that may be used in the fifth layer to provide spin polarization are Co, Ni, and Fe, or combinations thereof.

The fifth layer may range in thickness from less than 10 nm to several hundred nm, such as up to 250 nm thick, or more. In some embodiments this fifth layer may range in thickness from about 5 nm to about 10 nm. In other embodiments this fifth layer may range in thickness from about 10 nm to about 100 nm. In still other embodiments this fifth layer may range in thickness from about 100 nm to about 500 nm.

In some embodiments where the cathode is opaque, the anode may be transparent so light may be emitted from the device. Alternatively, if the anode is opaque, the cathode may be transparent to allow light to be emitted by the device. As previously noted, the cathode and the anode may optionally both be transparent to allow light to be emitted from the devise in both directions (i.e., in the anode-to-cathode directions and in the cathode-to-anode direction).

In those embodiments where a sixth layer is present, the sixth layer may be referred to as a "substrate." In such embodiments, the sixth layer may be a transparent layer. In those embodiments where there is a sixth layer and it is transparent, the sixth layer may also be conductive. In such embodiments the sixth layer may be referred to as a transparent conductive layer. In some such embodiments, this transparent conductive sixth layer may be composed of strontium tin oxide (STO). In other embodiments it may be composed of indium tin oxide (ITO). In still other embodiments this sixth layer may be composed of combinations of STO and ITO. In an exemplified embodiment, this 6th layer is present and is composed of STO (see FIG. 1(c)). Additionally, materials that have properties similar to STO or ITO may be used in other embodiments as the sixth layer, as would be appreciated by the artisan skilled in the fabrication of light-emitting diodes. In an exemplified embodiment, the anode is LSMO, and the sixth layer is present, and is composed of STO. In other embodiments, when the anode is Co, Ni or FE, the sixth layer may also be present, and may be composed of a transparent conductive material, such as STO or ITO, or combinations thereof.

In those embodiments where LiF is used as the buffer layer, the LiF-containing buffer layer may be about 0.8 nm to about 1.5 nm in thickness, and the LiF-containing buffer layer is positioned between the cathode and the organic layer. In such embodiments, the organic layer may comprise D-DOO-PPV in a thickness of about 25 nm. In such embodiments, the cathode may be composed of Co and the anode may be composed of LSMO. Alternatively, in other embodiments, the cathode may be composed of LSMO and the anode may be composed of Co, or the cathode and anode may be composed of other suitable ferromagnetic materials. In still other embodiments, the cathode and anode may be composed of the same ferromagnetic material, such as Co or LSMO, but the cathode and anode may have different dimensions sufficient to facilitate alteration of their magnetization directions independently of each other. In some embodiments, the device may utilize a turn-on voltage ($V_o$) of about 3.5 V (FIG. 1($c$)). In a similar embodiment that lacks a buffer layer of LiF, an observed $V_o$ was 10 V. In those embodiments of the OSV lacking a LiF-containing buffer layer, without being limited to any one theory, it is thought that hole injection is more efficient than electron injection, leading to unbalanced current density, which, in turn, leads to the current being carried largely by holes. In such a system, it is thought that EL intensity may be limited by the minority electron injection from the Co cathode. Use of lithium fluoride as a buffer layer between the Co cathode and the organic layer, may result in an improved electron injection efficiency, and a decrease of charge spin polarization ($P_x$) in some embodiments. The use of a combination of various metals or metal alloys for ferromagnetic electrodes, and various salts in the buffer layer between the cathode and the organic layer, to make injection of spin-aligned electrons into the organic layer of the OSV more facile, is within the scope of the present disclosure.

Exemplary devices made in accordance with the present disclosure exhibited at least one of the following traits: (i) efficient electroluminescence at relatively low $V_b$; (ii) sizable spin injection capability from the ferromagnetic electrodes; (iii) large spin diffusion length in the organic interlayer; and (iv) the ability to control the intensity of light emitted from the diode with an external magnetic field.

Thus, in some embodiments, the disclosure provides spin-OLEDs based on bipolar OSVs. In these spin-OLEDs, the use of a π-conjugated organic polymer interlayer in which some or all of the hydrogen atoms proximal to the backbone chain of the polymer, such as, in some embodiments, some of all of the hydrogens attached directly to intrachain carbon atoms, were replaced with deuterium. In such spin-OLEDs, the spin diffusion lengths for injected spin-aligned carriers may be increased, promoting polaron pair (PP) formation. Since hyperfine interactions are known to limit spin diffusion lengths, and since replacing hydrogens with deuteriums may reduce hyperfine interactions within organic polymers, it was believed that use of a deuterated π-conjugated organic polymer in the organic interlayer might increase spin diffusion lengths sufficiently to improve the efficiency of PP formation. In some exemplified spin-OLEDs according to the disclosure, a deuterated form of poly(dioctyloxy) phenyl vinylene (H-DOO-PPV) is employed in the organic interlayer. This deuterated form of H-DOO-PPV (i.e., D-DOO-PPV) has been found to have a $\lambda_s$ of about 45 nM, which is about three times that of the non-deuterated H-DOO-PPV polymer.

The use of a thin buffer layer between the cathode and the deuterated, π-conjugated organic polymer may improve the efficiency of spin-aligned electron injection from the cathode into the organic layer, which was thought to have been limiting. In some exemplified spin-OLEDs of the disclosure, the buffer layer was composed of the salt, LiF, which was deposited with thicknesses ranging between about 0.8 nm to about 1.5 nm between the Co cathode and the deuterated, π-conjugated organic polymer interlayer. Without being limited to any one theory, it is believed that this buffer layer of LiF may improve the efficiency of spin-aligned electron injection into the organic interlayer, and may also serve to physically block Co inclusions directly from the cathode into the organic interlayer.

It should be understood that the skilled artisan, apprised of the present disclosure, would be able to propose alternative components for use in preparing analagous spin-OLEDs utilizing these two technical advances. For example, the skilled artisan would recognize other π-conjugated organic polymers which, once synthesized in a deuterated form, might be used in place of the D-DOO-PPV found in the organic layer of the presently disclosed devices. Similarly, the skilled artisan would recognize other buffer compounds could be used to form a thin layer between the cathode and the organic interlayer, which, like LiF, would be expected to improve the efficiency of spin-aligned electron injection from the cathode into the organic layer. Hence, the skilled artisan, once apprised of the advantages of using deuterated π-conjugated organic polymers in the organic interlayer, and including a thin buffer layer between the cathode and the organic interlayer, will be able to design and construct analogous spin-OLEDs in accordance with the teachings provided herein, by simply substituting other suitable substances with similar properties for the exact components employed in the presently disclosed devices. Such analogous spin-OLEDs are within the purview of the present disclosure.

The specific examples included herein are for illustrative purposes only and are not to be considered as limiting to this disclosure. Any compounds, compositions, or materials used in the following examples are either commercially available or may be prepared according to standard literature procedures by those skilled in the art. Any combination of the layers and alternative materials to make functional spin-OLEDs, in accordance with the teachings provided herein, are also within the context of this disclosure. In light of this disclosure, those of skill in the art will recognize that variations of the following examples, and other examples of the disclosed devices and methods, would be possible to envision and construct without undue experimentation.

EXAMPLES

Example 1

Figure 8:
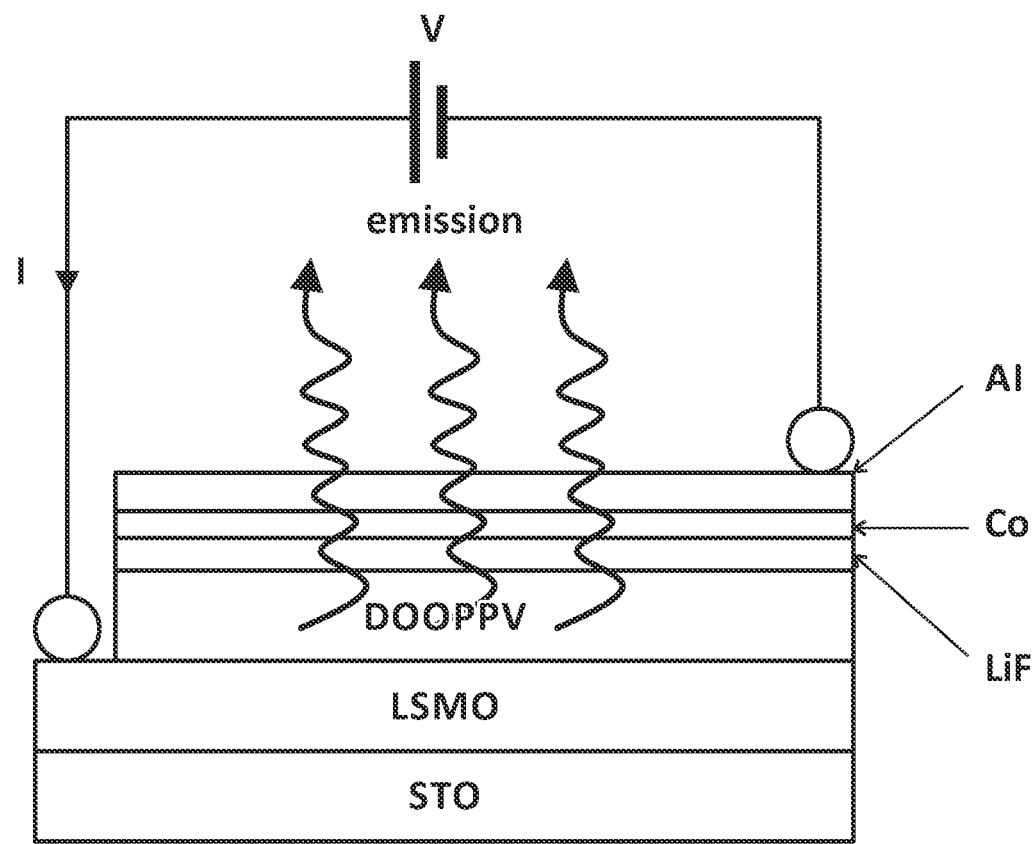
FIG. 8 illustrates, in two dimensions, the structure of the spin-OLED shown in three dimensions in FIG. 1(b).

A bipolar OSV device according to the design shown schematically in three-dimensions in FIG. 1($b$), and two-dimensions in FIG. 8, was engineered. The first layer was aluminum; the second layer was a ferromagnetic electrode, particularly a cathode, composed of cobalt, that was about 5 nm thick; the third layer was a buffer layer composed of LiF, that was about 1.5 nm thick, the fourth layer was a π-conjugated organic polymeric layer composed of deuterated poly(dioctyloxy) phenyl vinylene (D-DOO-PPV), that was about 25 nm thick, the fifth layer was a ferromagnetic electrode, particularly an anode, composed of La$_{0.7}$Sr$_{0.3}$MnO$_3$ (LSMO), that was about 200 nm thick and the sixth layer, upon which the fifth layer was affixed, was a transparent conductive substrate layer composed of strontium tin oxide (STO), that was a few hundred nm thick.

The turn-on voltage, V$_o$, where a sizable electroluminescence emission is realized when the double-injection condition is reached, was about 3.5 V in this bipolar OSV device.

Since the hyperfine interactions within D-DOO-PPV are considerably lower than within the non-deuterated analogue, H-DOO-PPV, the spin diffusion length ($\lambda_s$) was increased about three times to ~45 nm (i.e., a distance greater than the thickness of the organic layer of the device).

At cryogenic temperatures, the ferromagnetic anode (FM1=LSMO) and cathode (FM2=Co) in the disclosed spin-OLED had nominal spin injection degrees of polarization of P$_1 \approx$95% and P$_2 \approx$30%. However, P$_2$ substantially dropped when the LiF-containing third (buffer) layer was included. Because B$_c$(FM1) was not equal to B$_c$(FM2), the relative magnetization directions of the two FM electrodes in the disclosed spin-OLED could be switched between parallel (↑↑) and antiparallel (↑↓) relative alignments by sweeping an external magnetic field B (horizontal arrows in FIG. 2A), whereby the device resistance, conductance, and EL intensity reproducibly depended on the relative magnetization of the FM electrodes. This allowed measurement of MEL(B) and MC(B) at various bias voltages, temperatures, and device thicknesses.

FIG. 2($a$) represents a magneto-electroluminescence MEL(B) response measured at V$_b$=4.5 V and T=10° K., plotted as MEL$_{EX}$(B); it is composed of two components: (i) a non-hysteretic positive MEL$_{LSMO}$; and (ii) a hysteretic negative MELSV, which follow a formula of MEL$_{EX}$(B)= [EL(B)-EL(spin-up)]/EL(spin-up). The latter response consists of a downward sharp jump of 0.4% in the anti-parallel magnetization configuration between 4 and 30 mTesla (mT), which follows the electrodes coercive fields (FIG. 2($d$)). The MEL$_{LSMO}$ response is due to the magnetic properties of the LSMO electrode; it is a monotonic function of |B| and symmetric with respect to B=0. A similar EL component was measured before in ferromagnetic-OLED devices based on Alq$_3$ and was ascribed as due to the non-spin-valve MEL response of the organic interlayer. In that case the sudden change in the EL(B) response at the electrodes respective B$_c$s is interpreted as caused by the stray field, B$_s$, that arises from the proximity of the ferromagnetic electrodes to the organic interlayer. The stray magnetic field (B$_S$) of the electrodes was found to be ~0.7 mT for the LSMO electrode and <3.5 mT for the Co electrode, which was too small to cause the MEL$_{SV}$ component in FIG. 2($a$).

Data analysis was performed by subtracting the smooth MEL$_{LSMO}$ response from the MEL$_{EX}$(B) data to obtain the net response, MEL$_{SV}$(B)=MEL$_{EX}$-MEL$_{LSMO}$ as shown in FIG. 2($b$). The obtained MEL$_{SV}$(B) displays the typical hysteretic spin-valve characteristic response with sharp jumps at the LSMO and Co coercive fields.

A prominent feature of the MEL$_{SV}$(B) response is the very weak dependence of its maximum value on V$_b$, as seen in FIG. 2($c$). Unlike the strong decrease of the magneto-resistance with V$_b$ in homopolar OSV devices, the performance of the bipolar OSV device here does not degrade with V$_b$.

FIG. 2($d$) represents the Magneto-optic Kerr effect measurements of the LSMO and Co/lithium fluoride electrodes, showing coercive fields B$_{c1}$~5 mT and B$_{c2}$~35 mT, respectively.

FIG. 3 illustrates characteristics of MEL in the OSV over a temperature range (FIG. 3($a$)) and how the OSV behaves at constant temperature with a varied magnetic field (FIGS. 3($b$)-3($e$)). In FIG. 3($a$), a comparison is shown between the maximum magneto-electroluminescence, MEL$_{max}$, and the measured LSMO bulk magnetization, M(T), plotted against temperature. As is clearly seen MEL$_{max}$(T) almost perfectly follows the M(T) response. This behavior contrasts the maximum magneto-resistance, MR$_{max}$(T), in homopolar OSV devices, where a steeper temperature dependence is observed because of the LSMO surface magnetization. The fit in FIG. 3($a$) is a Brillouin function, B$_J$(T/T$_C$) with J=5/2 and T$_C$=307° K. FIGS. 3($b$)-3($e$) illustrate MEL$_{SV}$(B) response at selected temperatures.

The non-hysteretic background MC response is removed from the measured response, MC$_{EX}$, to leave the response of interest for the spin valve, the net MC$_{SV}$ response. The net MC$_{SV}$ response, is shown in FIGS. 4($a$)-4($b$) for the bipolar (lithium fluoride/cobalt cathode) OSV device and in FIGS. 4($d$)-4($e$) for the homopolar (cobalt cathode) OSV device. The opposite sign of the two MC response sets demonstrates that the lithium fluoride layer reverses the cathode spin polarization. FIG. 4($c$) and FIG. 4($f$) display MC$_{max}$≡max (|MC$_{SV}$(B)|) as a function of V$_b$ for the homopolar and bipolar OSV devices. Although the MC$_{max}$ (V$_b$) dependence of the bipolar OSV device sharply decreases for V$_b$<3.5 volts, it abruptly levels off at V$_o$=3.5 V, becoming practically voltage independent. This property of the bipolar OSV device facilitates the realization of spin-OLED at V$_b$>V$_o$ and is a property introduced by the lithium fluoride buffer layer.

There are two regimes in the MC$_{SV}$(V$_b$) response for the bipolar OSV, as seen in FIG. 4($c$): (i) V$_b$<V$_o$ which is the hole-only injection regime, MC$_{SV}$ decreases by a factor of ~50 between V$_b$≈0 and V$_b$=3.5 V; similar to a homopolar OSV based on D-DOO-PPV, which is displayed in FIG. 4($f$); and (ii) at V$_b$>V$_o$ which is the bipolar injection regime, MC$_{SV}$(V$_b$) is practically voltage independent which contrasts MC$_{SV}$(V$_b$) of the homopolar device. Consequently, MEL$_{SV}$ is also voltage independent as shown in FIG. 2($c$).

The respective nominal spin injection polarization degree (P$_x$) of the OSV device was P1~95% and P2~30%. An estimate of P$_2$ in the OSV device with LiF was obtained from the measured MC at low V$_b$, as shown FIG. 4($c$); using the Julliére formula, P$_2$ was estimated to be ~2% in the device. Since B$_{c1}$≠B$_{c2}$ for the ferromagnetic electrodes used here, then it was possible to switch their relative magnetization directions between parallel and anti-parallel alignments upon sweeping the external magnetic field, B.

Homopolar OSV devices become less efficient at large V$_b$ for operation, such that the performance of homopolar OSV devices severely degrades with V$_b$, in contrast with bipolar OSV devices. The homopolar MC component decreases with increasing V$_b$ whereas the recombination MC component does not depend on V$_b$. While not wishing to be bound by theory, it is believed that at V$_b$<V$_o$ the bipolar MC(V$_b$) response is dominated by the hole-only OSV that monotonically decreases with V$_b$; but as bipolar injection sets in at V$_o$ the voltage independent MC$_R$ takes over, and the MC(V$_b$) response becomes V$_b$ independent. In addition, the obtained ratio MEL$_{SV}$/MC$_{SV}$~25 obtained at V$_b$>4 V (FIGS. 2($c$) and 4($c$)) is in agreement with the larger MEL predicted, where MEL/MC~J$_h$/J$_R$>>1.

Example 2

Figure 5:
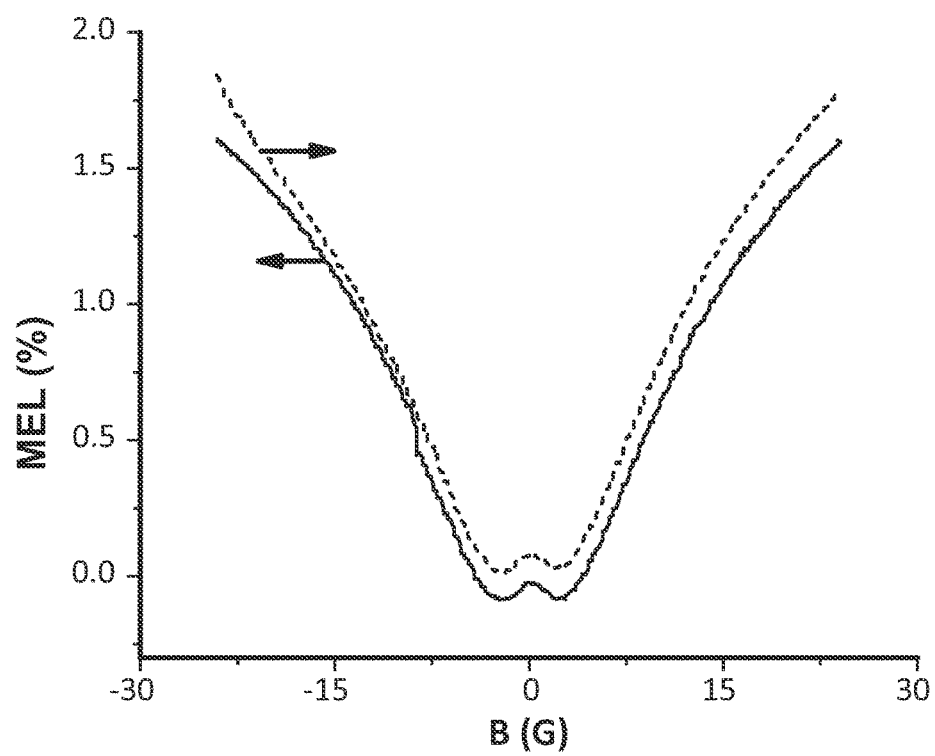
FIG. 5 illustrates a magneto-electroluminescence response for another embodiment of an OLED device.

A bipolar OLED device was created comprising the layers: Indium Tin Oxide (ITO)/Poly(3,4-ethylenedioxythiophene) (PEDOT)/Deuterated poly(dioctyloxy) phenyl vinylene (D-DOO-PPV)/Cobalt (Co)/Aluminum (Al). An example of the MEL response for this device is shown in FIG. 5.

Example 3

Figure 6:
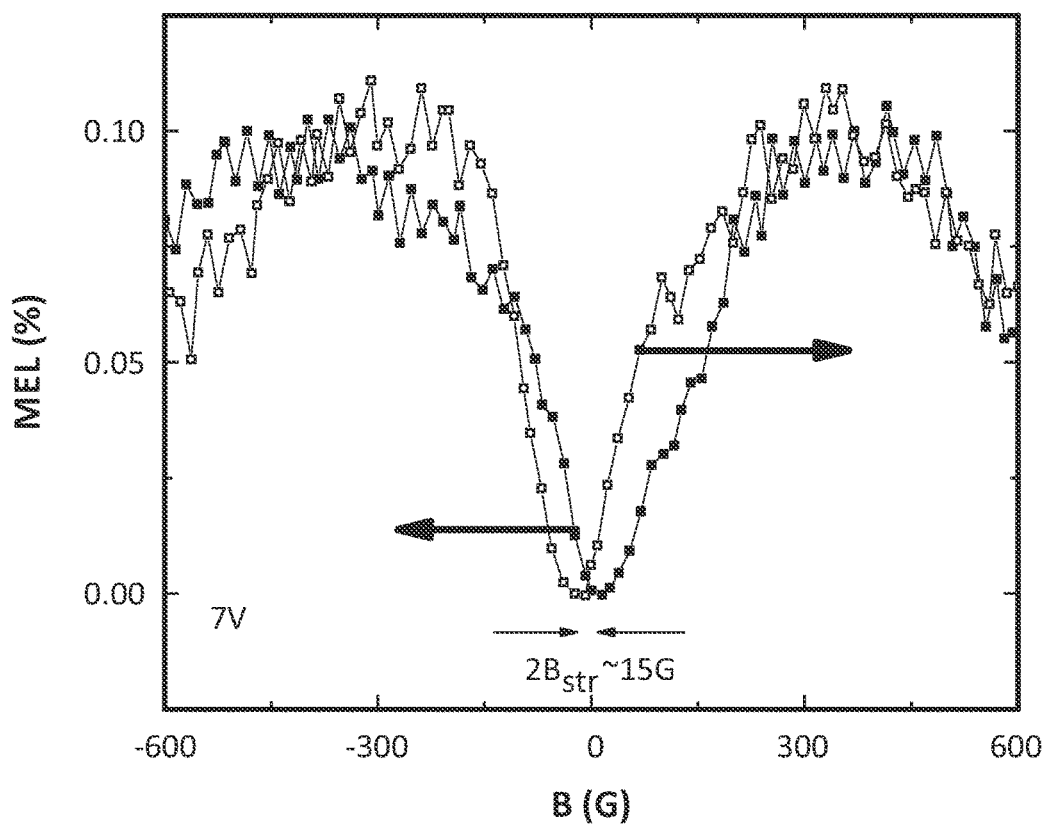
FIG. 6 illustrates the magneto-electroluminescence realized with a ferromagnetic LaSrMnO3 (LSMO) anode and a Lithium Fluoride/Aluminum cathode in a spin-OLED.

A bipolar OLED device was created comprising the layers: LaSrMnO (LSMO)/Deuterated poly(dioctyloxy) phenyl vinylene (D-DOO-PPV)/Lithium Fluoride (lithium fluoride)/Aluminum (Al). An example of the MEL response for this device is shown in FIG. 6.

Example 4

Figure 7:
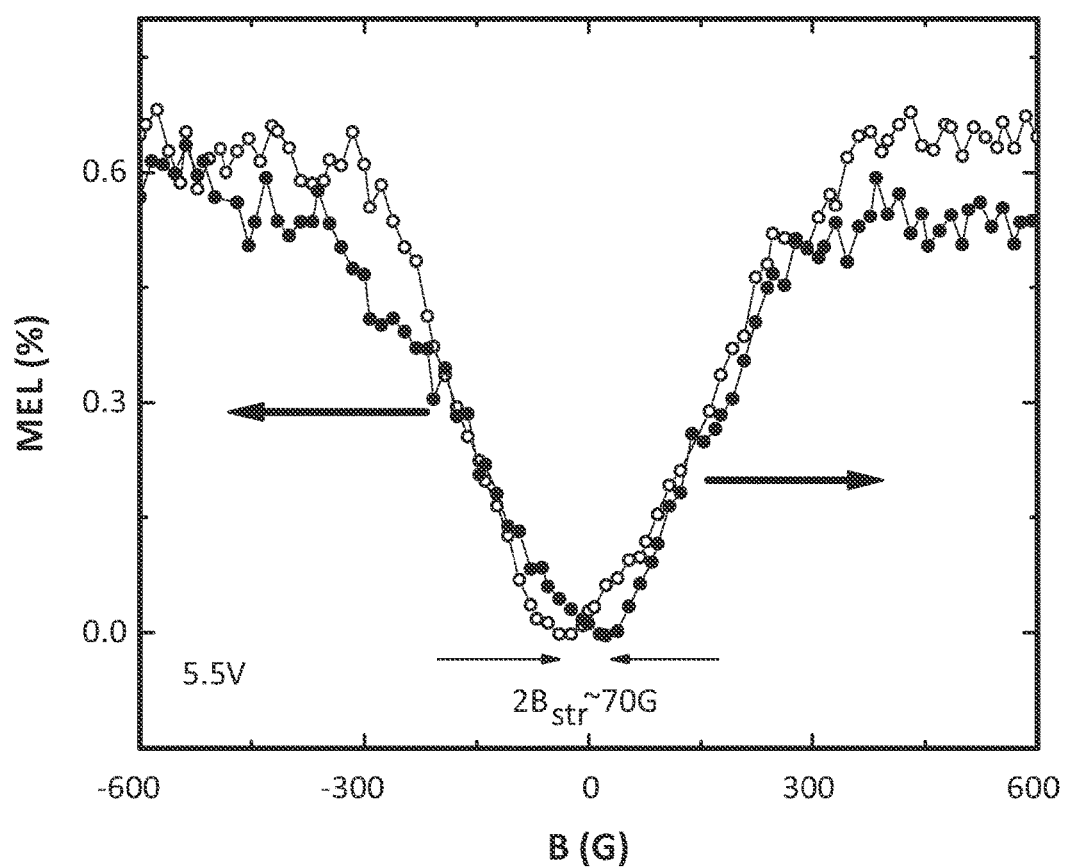
FIG. 7 illustrates the magneto-electroluminescence realized with a non-ferromagnetic indium tin oxide anode and a Lithium Fluoride/Cobalt cathode.

A bipolar OLED device was created comprising the layers: Indium Tin Oxide (ITO)/Deuterated poly(dioctyloxy) phenyl vinylene (D-DOO-PPV)/Lithium (Li)/Cobalt (Co). An example of the MEL response for this device is seen in FIG. 7.

The examples and embodiments disclosed herein are to be construed as merely illustrative and exemplary, and not to limit the scope of the present disclosure in any way. It will be apparent to those having skill in the art, with the aid of the present disclosure, that changes may be made to the details of the above-described embodiments without departing from the underlying principles of the disclosure herein. It is intended that the scope of the invention be defined by the claims appended hereto and their equivalents.

The invention claimed is:

1. An organic bipolar spin valve device, comprising:
an organic layer having a first side and a second side;
a ferromagnetic cathode layer coupled to the first side of the organic layer;
a ferromagnetic anode layer directly coupled to the second side of the organic layer; and
a buffer layer positioned between the ferromagnetic cathode layer and the first side of the organic layer and having a thickness between 0.5 and 2 nanometers, wherein the thickness, position, and composition of the buffer layer are configured to improve efficiency of electron injection into the organic layer from the ferromagnetic cathode layer in accordance with an efficiency of hole injection from the ferromagnetic anode layer directly coupled to the second side of the organic layer to thereby balance current density within the organic layer.

2. The device of claim 1, wherein the device is a spin-polarized light-emitting diode (spin-OLED) that exhibits electroluminescence when a bias voltage is applied across the layers, wherein the buffer layer is configured to reduce a turn-on bias voltage of the device.

3. The device of claim 2, wherein the device is sensitive to the spin-polarization of carriers (electrons and electron holes) injected from the ferromagnetic electrodes.

4. The device of claim 2, wherein intensity of electroluminescence may be adjusted by altering a magnetic polarization of one or more of the ferromagnetic cathode layer and the ferromagnetic anode layer.

5. The device of claim 2, wherein the spin-OLED exhibits magneto-electroluminescence (MEL) of about 1% at the bias voltage (Vb) of about 3.5 volts.

6. The device of claim 1, further comprising a protective layer on the ferromagnetic cathode layer.

7. The device of claim 6, wherein the protective layer is composed of a material suitable for providing protection from one of physical damage and chemical damage.

8. The device of claim 1, wherein the buffer layer comprises a film deposited on the ferromagnetic cathode layer.

9. The device of claim 1, wherein the ferromagnetic cathode layer is composed of cobalt or a cobalt alloy.

10. The device of claim 1, wherein the buffer layer enhances injection of spin-aligned electrons from the ferromagnetic cathode layer into the organic layer.

11. The device of claim 1, wherein the buffer layer is composed of a salt.

12. The device of claim 1, wherein the buffer layer is composed of lithium fluoride.

13. The device of claim 1, wherein the organic layer comprises an organic polymer.

14. The device of claim 1, wherein the organic layer comprises a a π-conjugated organic polymer.

15. The device of claim 1, wherein the organic layer comprises a deuterated π-conjugated organic polymer.

16. The device of claim 1, wherein the organic layer comprises deuterated poly(dioctyloxy)phenyl vinylene (D-DOO-PPV).

17. The device of claim 1, wherein the ferromagnetic anode is composed of LaSrMnO3 (LSMO).

18. The device of claim 17, wherein the stoichiometry of the LSMO is approximately La0.7Sr0.3MnO3.

19. The device of claim 1, wherein the ferromagnetic anode layer is attached to a transparent material.

20. The device of claim 19, wherein the transparent material is a conductive material.

21. The device of claim 20, wherein the transparent conductive material is composed of strontium tin oxide (STO), indium tin oxide (ITO), or combinations thereof.

22. The device of claim 1, wherein the ferromagnetic cathode layer and the ferromagnetic anode layer are either made from sufficiently different materials, or have sufficiently different geometries, to allow a magnetization direction of the ferromagnetic cathode to be altered independently of a magnetization direction of the ferromagnetic anode.

23. A spin-organic light-emitting diode (OLED), comprising:
an organic layer comprising a deuterated π-conjugated organic polymer, the organic layer having a first surface and a second surface;
an anode layer on the first surface of the organic layer, the anode layer configured to inject holes directly into the first surface of the organic layer;
a cathode layer on the second surface of the organic layer; and
a buffer layer positioned between the cathode layer and the second surface of the organic layer, wherein a thickness, position, and composition of the buffer layer are configured to balance a current density within the buffer layer by enhancing an efficiency of electron injection from the cathode layer into the second surface of the organic layer while an efficiency of hole injection from the anode layer directly into the first surface of the organic layer remains unchanged.

24. The spin-OLED of claim 23, wherein:
the cathode layer is disposed on a protective layer composed of aluminum or an aluminum alloy;
the cathode layer is composed of cobalt or a cobalt alloy;
the buffer layer is composed of lithium fluoride;
the organic layer is composed of Deuterated poly(dioctyloxy) phenyl vinylene (D-DOO-PPV); and
the anode layer is composed of LaSrMnO (LSMO).

25. The spin-OLED of claim 23, wherein the anode layer is attached to a layer of transparent conductive material.

26. The spin-OLED of claim 25, wherein the transparent conductive material is composed of strontium tin oxide (STO), indium tin oxide (ITO), or combinations thereof.

27. The spin-OLED of claim 23, wherein a magnetization direction of one or more of the anode layer and the cathode layer are independently alterable in response to subjecting the spin-OLED to an external magnetic field.

28. An apparatus, comprising:
an organic bipolar spin valve, comprising a plurality of layers, comprising;
a first layer,
a second layer comprising a ferromagnetic cathode,
a third layer comprising a buffer having a thickness between 0.5 and 2 nanometers,
an fourth layer comprising an organic layer having a first side and a second side, and
a fifth layer comprising a ferromagnetic anode in direct contact with the first side of the organic layer;
wherein the organic spin-valve is configured to emit electroluminescent light in response to a bias voltage, the bias voltage to cause the ferromagnetic cathode to inject electrons into the second side of the organic layer through the buffer, and to cause the ferromagnetic anode to inject holes directly into the first side of the organic layer at a hole injection rate; and
wherein the thickness, position, and composition of the buffer are configured to increase an electron injection rate at which electrons are injected into the second side of the organic layer from the ferromagnetic cathode while the hole injection rate remains unchanged, the buffer layer configured to increase the electron injection rate to the unchanged hole injection rate to thereby balance a current density within the organic layer.

29. The apparatus of claim 28, wherein the bias voltage is between about 3.5 volts and 10 volts.

30. The apparatus of claim 28, wherein the bias voltage is equal to or greater than a turn-on voltage of the organic bipolar spin valve.

31. The apparatus of claim 28, wherein the organic bipolar spin valve is configured to alter an intensity of the emitted electroluminescent light in response to a magnetic field.

* * * * *